(12) United States Patent
Tang et al.

(10) Patent No.: US 7,755,029 B2
(45) Date of Patent: Jul. 13, 2010

(54) OPTICAL NAVIGATOR SENSOR AND OPTICAL NAVIGATOR APPARATUS USING THE SAME

(75) Inventors: Jeffrey Yuh Fong Tang, Hsinchu (TW); Tsen Shau Yang, Hsinchu (TW); James Seng Ju Ni, Hsinchu (TW)

(73) Assignee: Myson Century, Inc., Hsinchu (TW)

( * ) Notice: Subject to any disclaimer, the term of this patent is extended or adjusted under 35 U.S.C. 154(b) by 0 days.

(21) Appl. No.: 12/119,655

(22) Filed: May 13, 2008

(65) Prior Publication Data

US 2009/0159788 A1  Jun. 25, 2009

(30) Foreign Application Priority Data

Dec. 25, 2007  (TW) .............. 96149893 A

(51) Int. Cl.
*H01J 40/14* (2006.01)
*H01J 5/02* (2006.01)

(52) U.S. Cl. .............. 250/239; 250/221; 257/433; 345/166

(58) Field of Classification Search .............. 250/221, 250/222.1, 239; 345/166; 257/432, 433, 257/434, 680
See application file for complete search history.

(56) References Cited

U.S. PATENT DOCUMENTS

| | | | | |
|---|---|---|---|---|
| 4,751,505 A | * | 6/1988 | Williams et al. | 345/166 |
| 6,462,330 B1 | * | 10/2002 | Venkat et al. | 250/239 |
| 6,541,762 B2 | * | 4/2003 | Kang et al. | 250/239 |
| 6,653,724 B1 | * | 11/2003 | Kim et al. | 257/684 |
| 6,835,923 B2 | * | 12/2004 | Hamalainen et al. | 250/227.11 |
| 7,045,775 B2 | | 5/2006 | Leong et al. | |
| 7,199,350 B2 | * | 4/2007 | Chien | 250/208.2 |
| 7,244,925 B2 | * | 7/2007 | Xie | 250/221 |
| 7,309,855 B2 | * | 12/2007 | Nagasaka et al. | 250/231.14 |
| 2003/0034441 A1 | * | 2/2003 | Kang et al. | 250/221 |
| 2006/0266934 A1 | * | 11/2006 | Lye Hock et al. | 250/221 |
| 2006/0284845 A1 | * | 12/2006 | Wu et al. | 345/166 |
| 2007/0057166 A1 | * | 3/2007 | Kuo et al. | 250/221 |
| 2007/0063130 A1 | * | 3/2007 | Ahn et al. | 250/221 |
| 2007/0138377 A1 | * | 6/2007 | Zarem | 250/221 |
| 2007/0188457 A1 | * | 8/2007 | Wu et al. | 345/166 |
| 2008/0149814 A1 | * | 6/2008 | Ooi et al. | 250/221 |
| 2008/0156967 A1 | * | 7/2008 | Oh et al. | 250/221 |
| 2008/0211049 A1 | * | 9/2008 | Grewal | 257/433 |

OTHER PUBLICATIONS

Office Action issued in counterpart Chinese Application No. 200810001070.3 on Mar. 18, 2010 and its English Abstract.

* cited by examiner

*Primary Examiner*—John R Lee
(74) *Attorney, Agent, or Firm*—Connolly Bove Lodge & Hutz LLP; Arlene P. Neal

(57) ABSTRACT

An optical navigator sensor for sensing an image of an object comprises a substrate, a laser diode, an optical sensor device and a housing. The optical sensor device and the laser diode are fixed on the base plate and covered by the housing. The housing guides the light emitted from the laser diode to the object and guides the light reflected from the object to the optical sensor device.

25 Claims, 5 Drawing Sheets

OPTICAL NAVIGATOR SENSOR AND OPTICAL NAVIGATOR APPARATUS USING THE SAME

BACKGROUND OF THE INVENTION (A) Field of the Invention

The present invention relates to an optical navigator sensor and optical navigator apparatus using the same, and more particularly, to an optical navigator sensor integrating light emitting device and optical sensor device, and to an optical navigator apparatus using the same.

(B) Description of the Related Art

From programming and document processing tools in the past, to entertainment devices for multimedia and video gaming nowadays, the roles computers serve have evolved in variety and become more and more important. As the interface between users and computers, mice have also evolved corresponding to the development of computers. The sensor techniques of mice, accordingly, have also adapted from ball-based, wheel-based, to LED-based and laser emitting device-based techniques, which utilize coherent light. Accordingly, the functions mice exhibit have extended from pure cursor moving to image zooming, fingerprint recognizing and a broad range of additional functions so that users can operate computers more easily.

FIG. 1 shows a cross-sectional view of a conventional optical mouse utilizing LED technique. The optical mouse 10 comprises a base plate 17 and a hole 11 on it, a lens/light pipe 19 settled on top of the hole 11, a circuit board 16 surrounding the lens/light pipe 19, an optical navigation sensor 13 settled on top of the lens/light pipe 19 and an LED 15. The base plate 17 could be placed on a surface 80, such as on a table or a mousepad, and can be moved along the surface 80. The light generated from the LED 15 is focused and guided by the lens/light pipe 19 and projected on the surface 80 through the hole 11. The light is reflected back from the surface 80 through the hole 11 and the lens/light pipe 19, passes through a hole on the bottom of the optical navigation sensor 13, and enters the optical navigation sensor 13. A photosensitive chip 12 in the optical navigation sensor 13 can capture the images induced by the optical mouse 10 moving through the surface 80, and compares the differences within to determine the amount of the displacement of the optical mouse 10.

The optical navigation sensor 13 is attached with a clip 14 to the circuit board 16 mounted on the base plate 17. Referring to the light path in FIG. 1, it is obvious that the accuracy of the 3D positioning of the LED 15, the lens/light pipe 19 and the optical navigation sensor 13 is very important. Any slight deviation may cause the optical navigation sensor 13 to be unable to receive light accurately. That is, conventional optical navigation apparatus, including optical mice, comprise many components that not only complicate the packaging process and cause higher manufacturing costs, but also require burdensome calibration to achieve a regular optical sensing function.

Therefore, there is a need to design an optical navigator sensor and optical navigator apparatus using the same that can be packaged with ease and costs less, so that the optical positioning process can be simplified and the accuracy thereof would not be compromised.

SUMMARY OF THE INVENTION

One aspect of the present invention is to provide an optical navigator sensor and optical navigator apparatus using the same such that light emitting device and optical sensor device can be integrated in a base plate with housing. Therefore, the quantity of components needing to be packaged can be decreased and the manufacturing cost can be reduced.

Another aspect of the present invention is to provide an optical navigator sensor and optical navigator apparatus using the same such that the alignment process is simplified. Therefore, the requirements of the relative position of the light emitting device and the optical sensor device can be relaxed.

In view of the aspects stated above, the present invention discloses an optical navigator sensor for sensing an image of an object comprising a substrate, a laser diode, an optical sensor device and a housing. The optical sensor device and the laser diode are fixed on the substrate and covered by the housing. The housing guides the light emitted from the laser diode to the object and guides the light reflected from the object to the optical sensor device.

The present invention further discloses an optical navigator apparatus comprising a circuit board, a laser diode, an optical sensor device, a housing covering and at least one electronic device. The optical sensor device and the laser diode are fixed on the circuit board and covered by the housing. The housing guides the light emitted from the laser diode to the object and guides the light reflected from the object to the optical sensor device. The electronic device is fixed on the circuit board to process the signals of the optical sensor device or to provide signals to the optical sensor device.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 2:
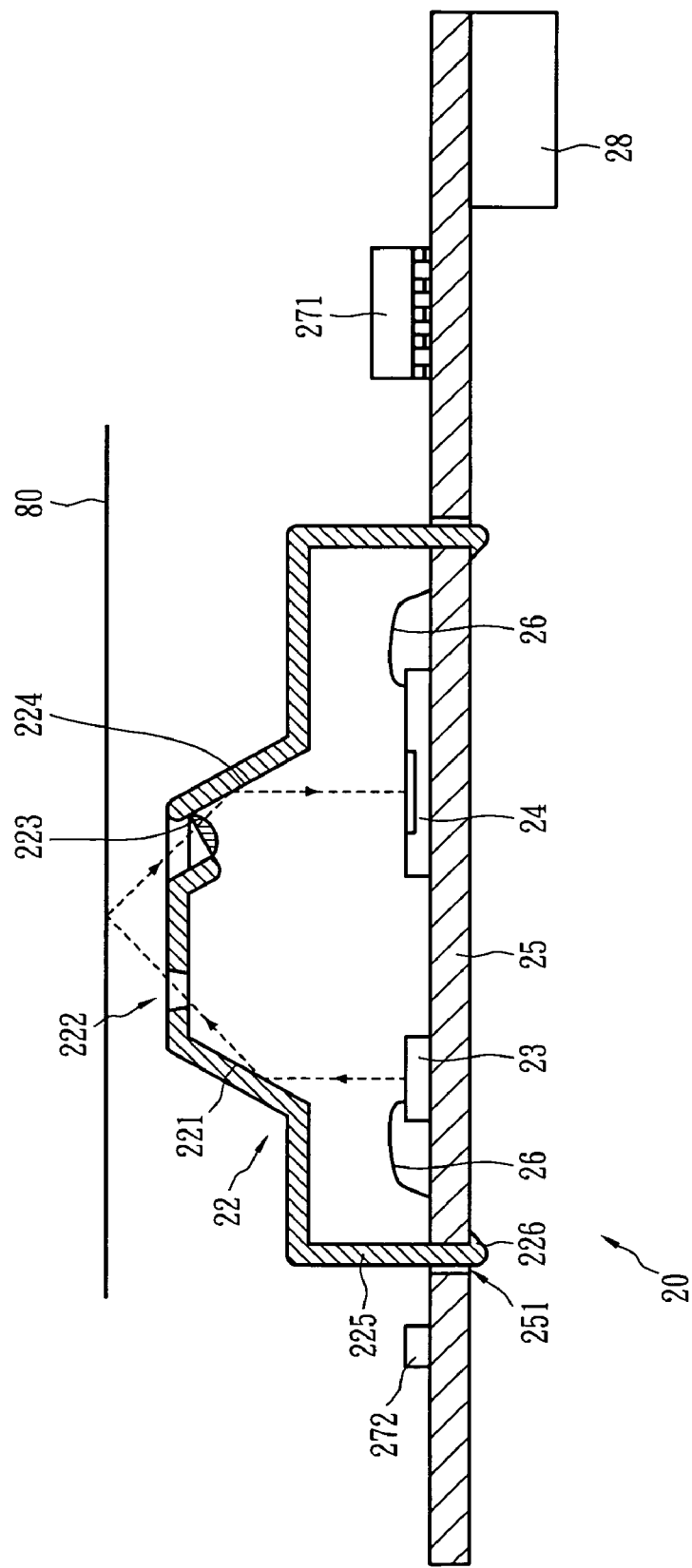
FIG. 2 shows a cross-sectional view of an optical navigator apparatus in accordance with an embodiment of the present invention.

FIG. 2 shows a cross-sectional view of an optical navigator apparatus in accordance with an embodiment of the present invention. The optical navigator apparatus 20 comprises a circuit board 25, a laser diode 23, an optical sensor device 24, a housing 22 and electronic devices 271 and 272. The laser diode 23 and the optical sensor device 24 are fixed on the circuit board 25 by surface mounting technique, electrically connected to the circuit board 25 via a plurality of metal wires 26, and covered by the housing 22 fixed on the circuit board 25. The coherent laser light emitted from the laser diode 23 is reflected by a first reflecting surface 221 in the housing 22 through a hole 222 of the housing 22 toward the surface of an object 80 being sensed. The housing 22 is an injection molded plastic part. The first reflecting surface 221 is coated by reflective material to fully reflect light. The object 80 reflects the light projecting toward it. A lens 223 of the housing 22 focuses the reflected light. If the laser light can easily focus, then the lens 223 can be removed. A second reflecting surface 224 in the housing 22 reflects the reflected light from the object 80 to the optical sensor device 24. The optical sensor device 24 transforms the received light signals into electronic signals. For example, a CMOS optical sensor device can transform an optical image signal into a digital signal.

The electronic devices 271 and 272, which could be active or passive devices, are fixed on the circuit board 25 and process the output signal of the optical sensor device 24 or provide signals to the optical sensor device 24, such as voltage signals or clock signals. The circuit board 25 receives and transmits signals from and to the outside of the optical navigator apparatus 20 through a connecting interface 28, such as a connector or a connecting terminal.

The main body 225 of the housing 22 is interlocked to the circuit board 25 by a retaining member 226. Alternatively, the retaining member 226 may be elastic so that it can extrude through a hole 251 of the circuit board 25 and lock on it to self-align with the circuit board 25. That is, the housing 22 can self-align with the relative position of the laser diode 23 and the optical sensor device 24 accordingly.

Figure 1:
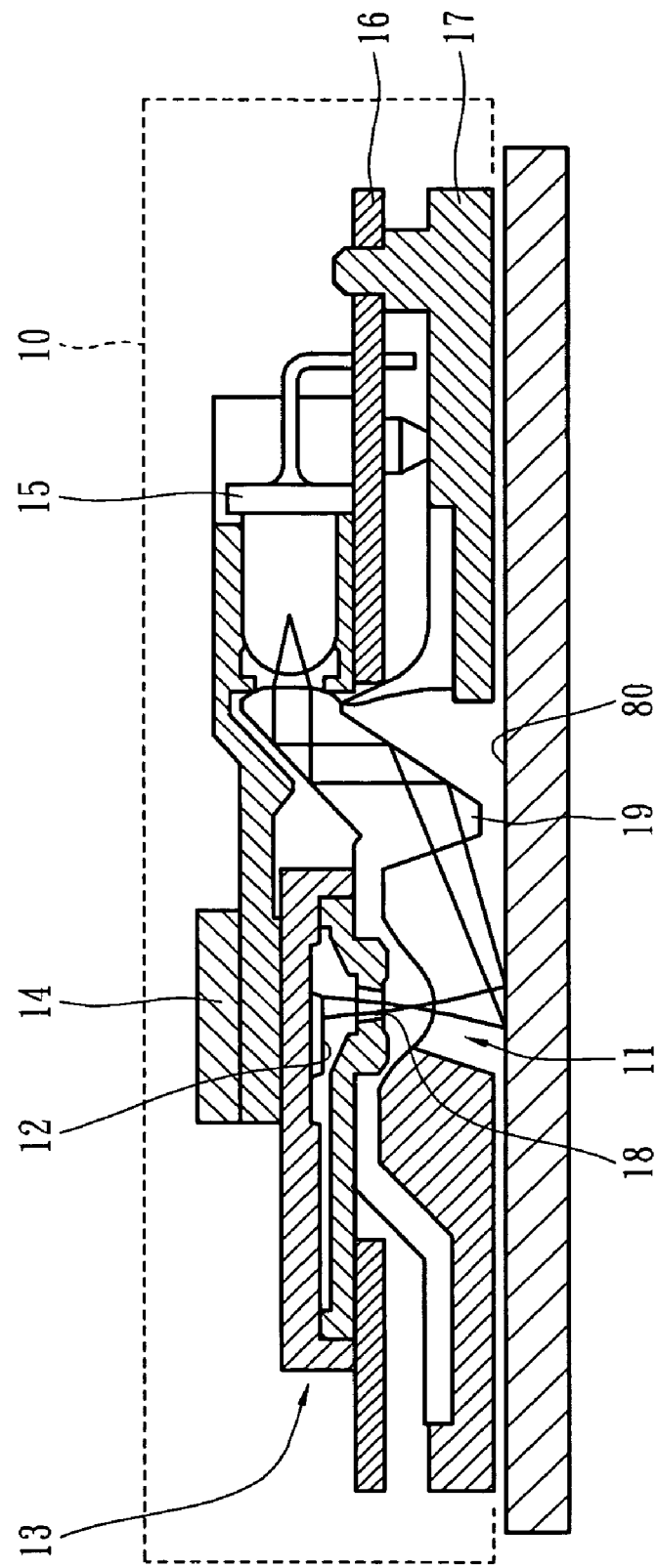
FIG. 1 shows a cross-sectional view of a conventional optical mouse.

Compared to the conventional optical mouse 10 in FIG. 1, the laser diode 23 and the optical sensor device 24 in the optical navigator apparatus 20 are fixed on the circuit board 25. In addition, a vertical cavity surface emitting laser (VCSEL) diode is used for the laser diode 23. Therefore, the laser light emitted is perpendicular to the surface of the VCSEL diode. It is obvious that the requirement for the relative position between the laser diode 23 and the optical sensor device 24 is reduced from 3D to 2D positioning. Therefore, not only is the amount of components to be packaged reduced in the embodiment of the present invention, but the optical positioning process is simplified as well.

Figure 3:
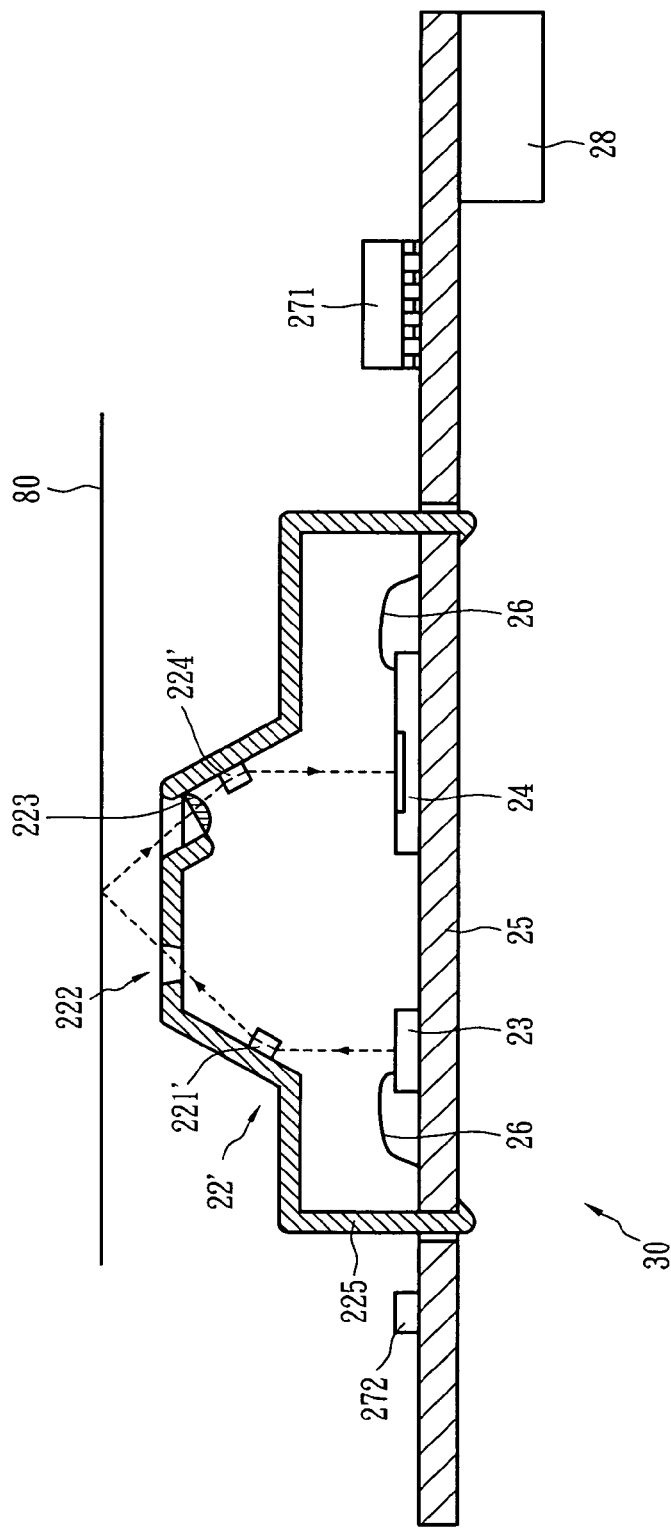
FIG. 3 shows a cross-sectional view of an optical navigator apparatus in accordance with another embodiment of the present invention.
Figure 4:
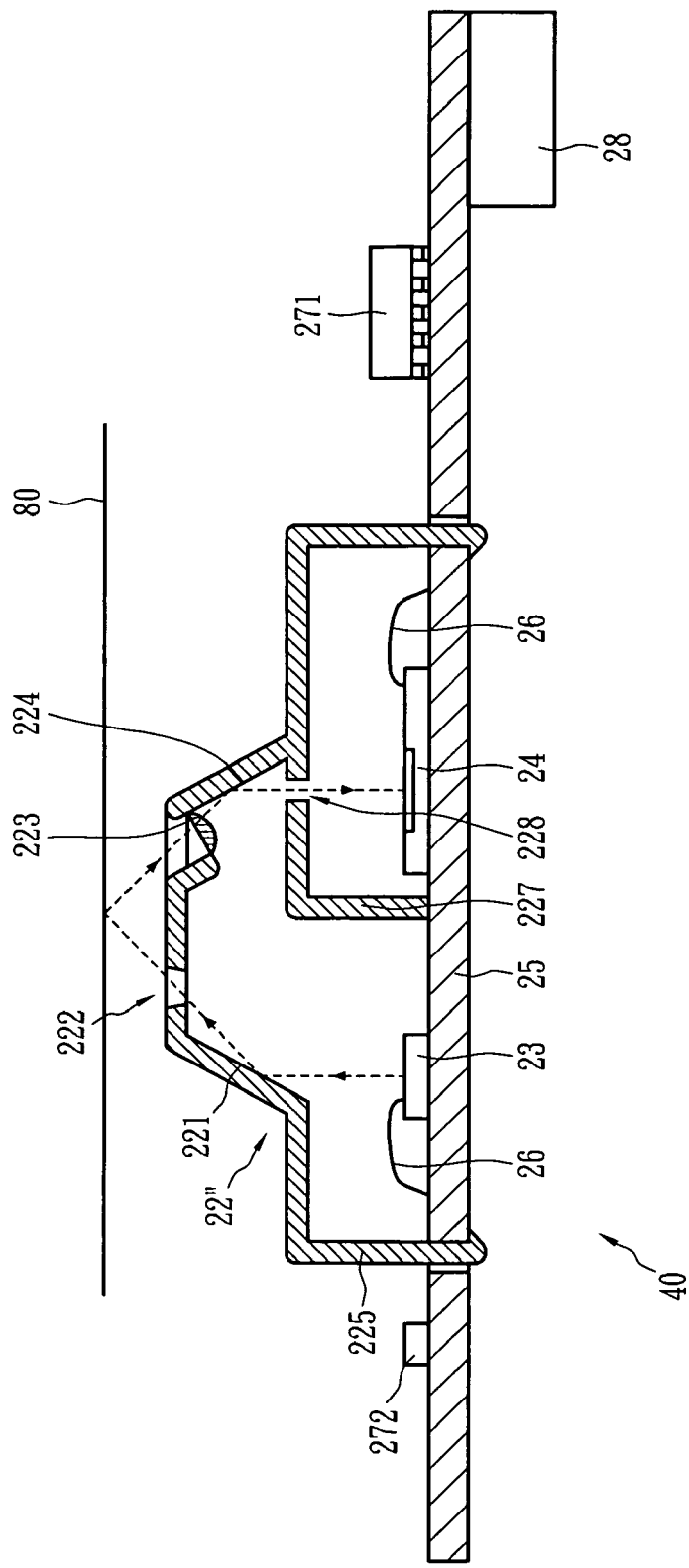
FIG. 4 shows a cross-sectional view of an optical navigator apparatus in accordance with another embodiment of the present invention.

FIG. 3 shows a cross-sectional view of an optical navigator apparatus in accordance with another embodiment of the present invention. Compared to the optical navigator apparatus 20 in FIG. 2, the first reflecting surface 221 and the second reflecting surface 224 are replaced with a first optical guiding unit 221' and a second optical guiding unit 224' respectively. The first optical guiding unit 221' guides the light emitted from the laser diode 25 through the hole 222 to the object 80. Likewise, the second optical guiding unit 224' guides the light reflected from the object 80 to the optical sensor device 24.

To prevent the optical sensor device 24 from being affected by environmental light sources or reflecting light not from the second optical guiding unit 224', a light shield 227 may cover the optical sensor device 24 to reject any interfering light. The light shield 227 could be an inwardly extending part of the main body 225 of the housing 22". There is a hole 228 on top of the light shield 227 to provide a path for the reflecting light from the second optical guiding unit 224' to pass through. Any environmental light source or reflecting light not from the second optical guiding unit 224' is rejected.

Figure 5:
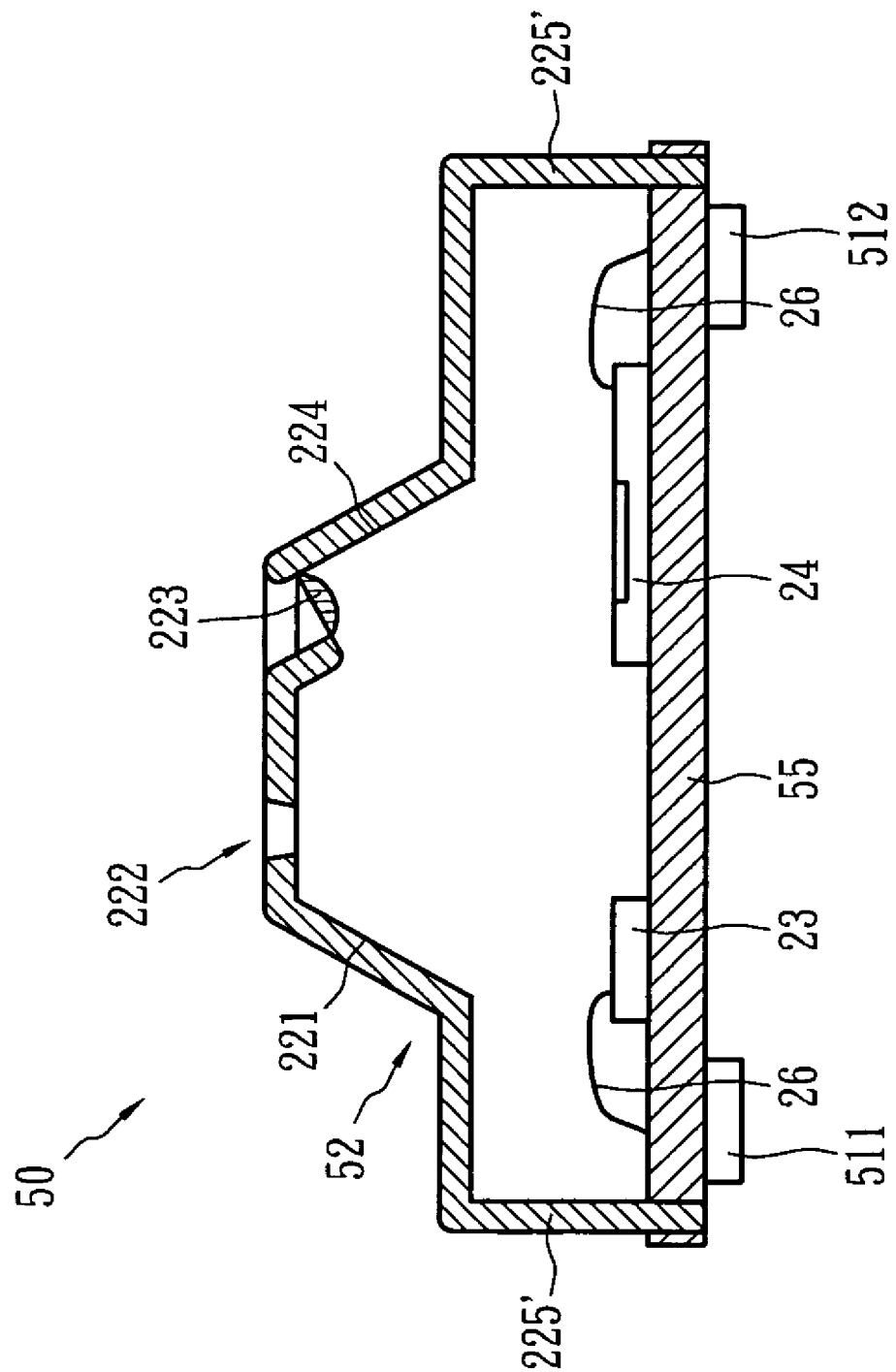
FIG. 5 shows a cross-sectional view of an optical navigator sensor in accordance with another embodiment of the present invention.

FIG. 5 shows a cross-sectional view of an optical navigator sensor of another embodiment of the present invention. The optical navigator sensor 50 comprises a substrate 55, a laser diode 23, an optical sensor device 24 and a housing 52. The laser diode 23 and the optical sensor device 24 are fixed on the substrate 55 and covered by the housing 52. The laser light emitted from the laser diode 23 is reflected by a first reflecting surface 221 in the housing 52 through a hole 222 of the housing 52 toward the surface of an object 80. The object 80 reflects the light back to the housing 52. The reflected light is then focused by a lens 223 and guided by a second reflecting face 224 to the optical sensor device 24. A main body 225' of the housing 52 is either inserted into the substrate 55 to be fixed or by any other combination mechanism to achieve the same effect, such as ultrasonic welding or adhesion techniques. There is a plurality of electrodes 511 and 512 disposed on the bottom surface of the substrate 55 such that the optical navigator sensor 50 can be surface mounted on the circuit board of a mouse.

The above-described embodiments of the present invention are intended to be illustrative only. Those skilled in the art may devise numerous alternative embodiments without departing from the scope of the following claims.

What is claimed is:

1. An optical navigator sensor for sensing an image of an object comprising:
   a substrate;
   a laser diode mounted on the substrate;
   an optical sensor device mounted on the substrate; and
   a housing covering the laser diode and the optical sensor device;
   wherein the housing guides the light emitted from the laser diode to the object only by one reflection and guides the light reflected from the object to the optical sensor device only by another reflection.

2. The optical navigator sensor of claim 1, wherein the housing comprises a first reflecting surface reflecting the light emitted from the laser diode to the object, and a second reflecting surface reflecting the light reflected from the object to the optical sensor device.

3. The optical navigator sensor of claim 1, wherein the housing comprises a first optical guiding unit guiding the light emitted from the laser diode to the object, and a second optical guiding unit guiding the light reflected from the object to the optical sensor device.

4. The optical navigator sensor of claim 1, wherein the housing comprises a lens focusing the light reflected from the object.

5. The optical navigator sensor of claim 1, wherein the housing comprises a light shield covering the optical sensor device and including a hole through which the light reflected from the object can pass.

6. The optical navigator sensor of claim 1, wherein the housing comprises a hole through which the light emitted from the laser diode to can pass.

7. The optical navigator sensor of claim 1, wherein the housing and the substrate are interlocked to each other by a retaining mechanism.

8. The optical navigator sensor of claim 1, wherein there is a plurality of electrodes disposed on the surface of the substrate.

9. The optical navigator sensor of claim 1, wherein the laser diode and the optical sensor device are electrically connected to the substrate via a plurality of metal wires.

10. The optical navigator sensor of claim 1, wherein the laser diode is a vertical cavity surface emitting laser (VCSEL) diode.

11. An optical navigator apparatus for sensing an image of an object comprising:
   a circuit board;
   a laser diode mounted on the circuit board;
   an optical sensor device mounted on the circuit board;
   a housing covering the laser diode and the optical sensor device; and
   at least one electronic device mounted on the circuit board to process the signals of the optical sensor device or to provide signals to the optical sensor device;
   wherein the housing guides the light emitted from the laser diode to the object only by one reflection and guides the light reflected from the object to the optical sensor device only by another reflection.

12. The optical navigator apparatus of claim 11, wherein the housing comprises a first reflecting surface directing the light emitted from the laser diode to the object, and a second reflecting surface directing the light reflected from the object to the optical sensor device.

13. The optical navigator apparatus of claim 11, wherein the housing comprises a first optical guiding unit guiding the light emitted from the laser diode to the object, and a second optical guiding unit guiding the light reflected from the object to the optical sensor device.

14. The optical navigator apparatus of claim 11, wherein the housing comprises a lens focusing the light reflected from the object.

15. The optical navigator apparatus of claim 11, wherein the housing comprises a light shield covering the optical sensor device with a hole through which the light reflected from the object can pass.

16. The optical navigator apparatus of claim 11, wherein the housing comprises a hole through which the light emitted from the laser diode can pass.

17. The optical navigator apparatus of claim 11, wherein the housing and the circuit board are interlocked to each other by a retaining mechanism.

18. The optical navigator apparatus of claim 11, wherein the laser diode and the optical sensor device are electrically connected to the circuit board via a plurality of metal wires.

19. The optical navigator apparatus of claim 11, wherein the laser diode is a vertical cavity surface emitting laser (VCSEL) diode.

20. The optical navigator apparatus of claim 11, further comprising a connecting interface set on the surface of the circuit board to receive and transmit signals.

21. The optical navigator sensor of claim 1, wherein the housing comprises a hole through which the light reflected from the object can pass and another hole through which the light emitted from the laser diode can pass.

22. The optical navigator apparatus of claim 11, wherein the housing comprises a hole through which the light reflected from the object can pass and another hole through which the light emitted from the laser diode can pass.

23. An optical navigator sensor for sensing an image of an object comprising:
   a substrate;
   a laser diode mounted on the substrate;
   an optical sensor device mounted on the substrate; and
   a covering means for covering the laser diode and the optical sensor device, guiding the light emitted from the laser diode to the object only by one reflection and guiding the light reflected from the object to the optical sensor device only by another reflection.

24. The optical navigator sensor of claim 4, wherein no reflection occurs between the object and the lens.

25. The optical navigator sensor of claim 14, wherein no reflection occurs between the object and the lens.

* * * * *